United States Patent [19]

Klunker et al.

[11] 3,743,895

[45] July 3, 1973

[54] COPPER PLATED BASE PLATE WITH NICKEL PLATED INSERT FOR SEMICONDUCTOR COMPONENT HOUSING

[75] Inventors: Heinz Klunker, Parsberg; Martin Rauch, Munich, both of Germany

[73] Assignee: Siemens Aktiengesellschaft, Munich, Germany

[22] Filed: Dec. 7, 1971

[21] Appl. No.: 205,631

[30] Foreign Application Priority Data

Dec. 10, 1970 Germany .................. P 20 60 933.0

[52] U.S. Cl. ...... 317/234 R, 317/234 A, 317/234 G, 317/234 L, 29/183.5, 29/590

[51] Int. Cl. ............................ H01l 5/00, H01l 3/00

[58] Field of Search .................... 317/234, 1, 4, 4.1, 317/5, 5.2, 5.3; 29/183.5, 195, 590

[56] References Cited

UNITED STATES PATENTS

| | | | |
|---|---|---|---|
| 2,905,873 | 9/1959 | Ollendorf et al. | 317/234 |
| 2,964,830 | 12/1960 | Henkels et al. | 317/234 |
| 2,975,928 | 3/1961 | Roovers | 317/234 |
| 3,119,052 | 1/1964 | Shigeru Tsuji | 317/234 |
| 3,319,134 | 5/1967 | Csakvary | 317/234 |

*Primary Examiner*—John W. Huckert
*Assistant Examiner*—Andrew J. James
*Attorney*—Arthur E. Wilfond, Herbert L. Lerner et al.

[57] ABSTRACT

A base plate for semiconductor component housings. The base plate is characterized in that only the portion of the base plate, to which the semiconductor is soldered, is nickel plated while the remainder is copper plated.

7 Claims, 2 Drawing Figures

Patented July 3, 1973 3,743,895

Figure 1:
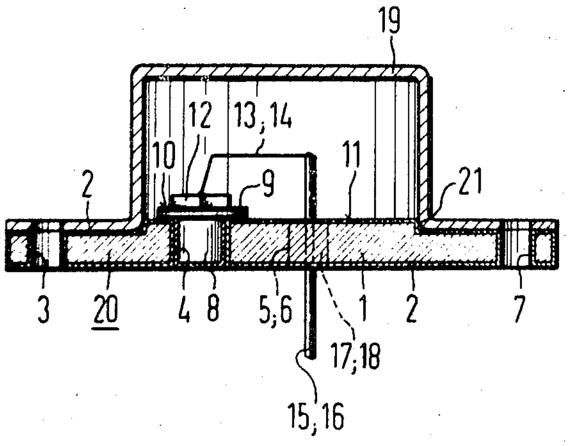

COPPER PLATED BASE PLATE WITH NICKEL PLATED INSERT FOR SEMICONDUCTOR COMPONENT HOUSING

The present invention relates to a base plate of a non-noble metal for component housings, particularly housings for semiconductor components, in which the component is attached to a part inserted in the base plate.

It is common practice to fasten a component to a base plate and to place a cap on the base plate so that the component is enclosed by the base plate and the cap to form a housing. The base plate here constitutes the essential part of the housing as the electrical leads to the component are brought through it into the housing.

In order to keep the manufacturing costs of base plates as low as possible, they are made of steel and coated with different metallic layers. These layers serve for protection against corrosion and are necessary for soldering components such as, for instance, a transistor system. In order to meet the requirements mentioned, several pretreatments of the base plate by electroplating are required in the processes used up to now.

In one known process, bottom plates of steel and pins of a nickel-iron alloy which later serve as the base and emitter terminals are first degreased separately, etched, annealed and copper plated. Then a slug-like part of copper, which is also called the anvil, is pressed into a hole in the already copper plated bottom plate. Two further holes of the bottom plate are also equipped with the already copper plated pins. The pins are fused by a thermal process with the glass while the anvil is simultaneously soldered in.

The bottom plate so pretreated is now called a base plate. In order to make it possible to solder to the base plate a component, such as for instance, a transistor system, the base plate is provided, over its entire surface, with multiple metal layers which are applied by electroplating. These multiple electroplating operations, which are carried out in electroplating barrels, stress the connecting wires, i.e., the emitter and base pins, very harshly due to hydrogen embrittlement and the continuous motion of the barrel. The connecting leads, bent by this process, must be straightened for assembly, whereby notches occur in the lead wires. The glass fusion points often fracture and will moisture enclosure caused thereby. The notches in the lead wires often cause the wire to break off during further mechanical processing.

After the required metal coatings are applied, the component is soldered on, the base plate is welded to a cap, the component housing formed thereby demetallized and finally again copper plated and tinned.

It is, therefore, an object of the present invention, to provide a base plate, which has the metal coatings necessary for corrosion protection and systems soldering and has lead wires and glass seals intact, and which, above all, can be manufactured simply. According to the invention only the part inserted into the base plate is coated with a nickel layer and the base plate with a copper layer.

In the base plate hereof only the part inserted in the base plate is provided with a nickel layer. It can be inserted immediately after the glass fusion is completed in the assembly, without the necessity of providing it with several metal coatings and straightening the lead wires. The former danger of wire breakage and fractures at the glass seals is here completely eliminated.

A further embodiment of the invention consists in that the part inserted into the base plate, which has the form of an anvil, is inserted into a hole of the base plate.

A further embodiment of the invention consists, finally, in a method for the manufacture of the base plate. According to this process, we first, separately, degrease, etch, anneal and copper plate the base plate without the anvil and the pins. Thereafter the anvil is nickel plated and inserted into the hole of the base plate and soldered together with the rest of the base plate. The pins are fused with glass beads into two further holes of the base plate. The transistor system is further assembled and soldered to the nickel layer of the anvil of the base plate. Finally, the electrical connections are made.

Further features and details of the invention will be seen from the following description of an example of an embodiment, with reference to the figures.

FIG. 1 shows a cross section through a housing with base plate; and

Figure 2:
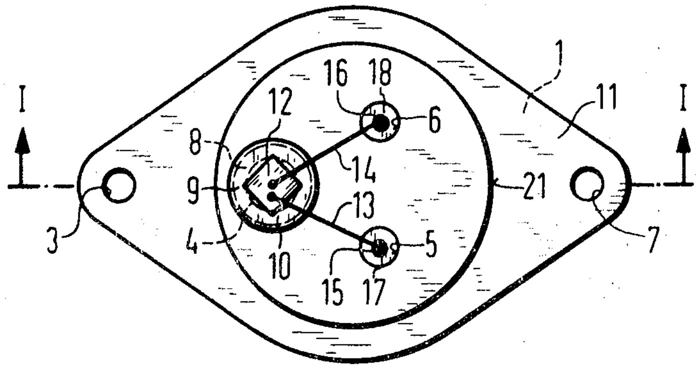

FIG. 2 a top view on the subject of FIG. 1, the cap being omitted.

In these Figures, corresponding parts have the same reference symbols.

The surface of a steel bottom plate 1 is provided with a copper coating 2, which is 6 to 8 $\mu$ thick. The bottom plate has holes 3,4,5,6,7. An anvil 8 of copper, which is coated with a 2 to 6 $\mu$ thick nickel layer 9 is soldered into the hole 4. The surface 10 of the anvil 8 is raised relative to the surface 11 of the bottom plate 1. Base plate 20 is formed of the bottom plate 1 with the copper coating 2 and the anvil 8 with the nickel coating 9 and the copper plated steel pins 15,16, which are fused into the holes 5,6 of the bottom plate 1 by means of the glass beads 17,18. A transistor system 12 is soldered to the nickel layer 9 covering the surface 10 of the anvil 8. The emitter and the base of the transistor system 12 are connected, via the contact springs 13, 14 with the pins 15,16. These pins 15,16 are coated on their surface with a copper film, not shown in the figure and serve as the electrical leads for the emitter and the base of the transistor system. The collector connection of the transistor system 12 is made via the entire base plate 20, while the anvil 8 makes good heat transfer possible.

A cap 19 of an iron nickel alloy is welded on the base plate 20. In order to assure a good fit of the cap 19 on the base plate 20, a small shoulder 21 is further provided on base plate 20 over which cap 19 is placed. The holes 3 and 7 in the base plate 20 serve for bolting the finished system to a conductor plate or the like.

The following describes an advantageous method for the manufacture of the base plate according to the invention and makes further reference to the drawings:

The bottom plate 1 is first degreased with trichloroethylene, then etched and annealed. The copper coating 2 is then applied to the bottom plate 20 by electroplating.

The pins 15,16 are similarly degreased with trichloroethylene, etched, annealed and thereafter copper plated.

The anvil 8 is then provided with the nickel coating 9 in another electroplating process.

The anvil 8, so pretreated, is inserted into the hole 4 of the copper plated bottom plate 1. The pins 15,16 are fused into the holes 5,6, of the bottom plate 1 via glass beads 17,18. In the same thermal process, the anvil 8 is soldered into the base plate 20. This converts the bottom plate 1 into base plate 20.

The transistor system 12 is then soldered to the nickel layer 9 which covers the surface of the anvil 8. In the same soldering operation the contact springs 13,14 are soldered to the pins 15, 16 and to the emitter connection and base contacts of the transistor system 12. Thereafter, the transistor system 12 is hermetically sealed by the cap 19, which is welded to the base plate 20.

The distinguishing feature of the invention is that it is now possible to nickel plate only the anvil 8 instead of the entire base plate 20. By eliminating several electroplating operations due to this, a substantial improvement of the quality, with a simplification of the manufacture, is achieved, thus resulting in cost reductions.

What is claimed is:

1. In a non-noble metal base plate for component housings for semiconductor components, in which the component is attached to a part inserted into the base plate, the improvement wherein the base plate is coated with a layer of copper and only the part inserted into the base plate is coated with a layer of nickel.

2. The base plate according to claim 1, wherein the part inserted into the base plate, which has the form of an anvil, is inserted into a hole in the base plate.

3. The base plate of claim 1, wherein the nickel layer has a thickness of between 2 and 6 $\mu$.

4. The base plate of claim 3, wherein the copper layer has a thickness of between 6 and 8 $\mu$.

5. A base plate for transistor housings according to claim 4 wherein the electrical connections of the emitter and the base are made through pins which are fused into the base plate by glass beads at the distance from the inserted part and which are connected with the emitter contact and the base contact via contact springs, and that the electrical connection of the collector is made via the inserted part of the base plate.

6. The base plate of claim 5, wherein the pins are copper coated steel pins.

7. A method for the manufacture of the base plate of claim 6 which comprises separately degreasing, etching, annealing and copper plating the base plate, nickel plating the anvil, inserting the anvil into a hole of the base plate and soldering the anvil with the rest of the base plate, fusing the pins into two additional holes of the base plate by glass beads, soldering a transistor system to the nickel layer of the anvil of the base plate, and thereafter making the electrical connections.

* * * * *